(12) United States Patent
Lassini et al.

(10) Patent No.: US 10,070,562 B2
(45) Date of Patent: Sep. 4, 2018

(54) METHOD AND APPARATUS FOR HEAT-DISSIPATION IN AN AVIONICS CHASSIS

(71) Applicant: GE AVIATION SYSTEMS, LLC, Grand Rapids, MI (US)

(72) Inventors: Stefano Angelo Mario Lassini, Lowell, MI (US); Stephen Nils Holen, Rockford, MI (US); Michael James Dusseau, Walker, MI (US)

(73) Assignee: GE Aviation Systems LLC, Grand Rapids, MI (US)

( * ) Notice: Subject to any disclaimer, the term of this patent is extended or adjusted under 35 U.S.C. 154(b) by 8 days.

(21) Appl. No.: 15/156,775

(22) Filed: May 17, 2016

(65) Prior Publication Data

US 2017/0339805 A1 Nov. 23, 2017

(51) Int. Cl.
*H05K 7/20* (2006.01)

(52) U.S. Cl.
CPC ....... *H05K 7/20854* (2013.01); *H05K 7/2039* (2013.01); *H05K 7/20863* (2013.01); *H05K 7/20872* (2013.01)

(58) Field of Classification Search
CPC ............. H05K 7/20854; H05K 7/2039; H05K 7/20863; H05K 7/20872
USPC .................................................. 361/720, 714
See application file for complete search history.

(56) References Cited

U.S. PATENT DOCUMENTS

| 4,396,935 A * | 8/1983 | Schuck ................. H01L 23/057 174/541 |
| 4,867,235 A * | 9/1989 | Grapes ................ H01L 23/3733 165/185 |
| 5,896,272 A | 4/1999 | Hendrix et al. |
| 6,721,182 B1 * | 4/2004 | Wells ................... H05K 7/1404 257/727 |
| 8,427,828 B2 | 4/2013 | Kehret et al. |
| 8,917,507 B2 | 12/2014 | Nagasawa |
| 2009/0122500 A1 | 5/2009 | Metzger |
| 2010/0319948 A1 | 12/2010 | Vander Ploeg et al. |
| 2010/0321892 A1 * | 12/2010 | Vander Ploeg ...... H05K 7/1412 361/707 |
| 2011/0267776 A1 | 11/2011 | Porreca et al. |
| 2013/0087366 A1 * | 4/2013 | Michael ................. H01L 23/50 174/252 |

(Continued)

FOREIGN PATENT DOCUMENTS

CN 103269571 A * 8/2013

OTHER PUBLICATIONS

Extended European Search Report and Opinion issued in connection with corresponding EP Application No. 7171396.9 dated Oct. 16, 2017.

*Primary Examiner* — Mandeep S Buttar
(74) *Attorney, Agent, or Firm* — GE Aviation Systems LLC; William Andes (57) ABSTRACT

A method and apparatus for heat-dissipation in an avionics chassis can include a housing having an outer surface, defining an exterior of the housing, an inner surface, defining an interior of the housing, and a set of walls at least partially separating the exterior of the housing from the interior of the housing, a heat generating component located within the interior of the housing, and a thermal plane thermally coupled to the heat generating component and configured to direct heat away from the heat generating component.

15 Claims, 6 Drawing Sheets

(56) References Cited

U.S. PATENT DOCUMENTS

2015/0181736 A1 6/2015 de Bock et al.
2015/0201527 A1 7/2015 Stringer et al.

\* cited by examiner

METHOD AND APPARATUS FOR HEAT-DISSIPATION IN AN AVIONICS CHASSIS

BACKGROUND OF THE INVENTION

Contemporary aircrafts use avionics in order to control the various equipment and operations for flying the aircraft. The avionics can include electronic components carried by a circuit board. The avionics or the circuit boards can be stored in an avionics chassis, which performs several beneficial functions, some of which are: electrically shielding the avionics from electromagnetic interference (EMI), protecting the avionics from lightning strikes, dissipating the heat generated by the avionics or electronic components, and protecting the avionics from environmental exposure.

BRIEF DESCRIPTION OF THE INVENTION

In one aspect, the present disclosure relates to an avionics chassis assembly including a housing having an outer surface, defining an exterior of the housing, an inner surface, defining an interior of the housing, and a set of walls at least partially separating the exterior of the housing from the interior of the housing, a heat generating component located within the interior of the housing, and a thermal plane thermally coupled to the heat generating component and configured to direct heat away from the heat generating component. An opening is included in the housing and the opening is configured to receive at least a portion of the thermal plane such that the at least a portion of the thermal plane passes through the opening and is located exteriorly of the housing to define an extending thermal plane portion.

In another aspect, the present disclosure relates to a heat-dissipating assembly including a housing having a set of planar walls defining an exterior of the housing and an interior of the housing, an electronic circuit board having a heat generating component, where the electronic circuit board is received within the interior of the housing, and a thermal plane in a thermally conductive relationship with the heat generating component and extending from the interior of the housing beyond at least one planar wall into an exterior environment surrounding the housing to define an extending thermal plane portion. The thermal plane is configured to conduct heat away from the heat generating component beyond the at least one planar wall and dissipate at least a portion of the heat to the exterior environment.

In yet another aspect, the present disclosure relates to method of assembling a heat-dissipating assembly, including overlying a thermal plane adjacent a heat producing component such that the heat producing component and the thermal plane are in a thermally conductive relationship, and mounting the thermal plane and the heat producing component within a chassis having a set of planar walls defining an interior of the housing, wherein at least a portion of the thermal plane extends beyond the housing into an exterior environment surrounding the housing to define an extending thermal plane portion.

DETAILED DESCRIPTION OF THE INVENTION

Aspects of the disclosure describe an approach to utilize an additional portion of a typical conduction cooled circuit card assembly for enhanced thermal dissipation. In typical conduction-cooled avionics, the heat generated by the electronics is collected by heat spreaders of various designs and materials and is conducted to the two sides of the circuit card that mate to the chassis by way of wedge locks. Minimal heat conduction occurs into the back plane, and no heat conduction occurs on the side opposite to the back plane (e.g. the card front). Avionics are constantly challenged with dissipating the heat produced within the electronic components to the environment. The extended range of temperature operation and the ever increasing power density of state of the art designs results in the thermal design of an avionic box becoming one of the main limiting factors in the performance of the system.

While "a set of" various elements will be described, it will be understood that "a set" can include any number of the respective elements, including only one element. Additionally, all directional references (e.g., radial, axial, upper, lower, upward, downward, left, right, lateral, front, back, top, bottom, above, below, vertical, horizontal, clockwise, counterclockwise) are only used for identification purposes to aid the reader's understanding of the disclosure, and do not create limitations, particularly as to the position, orientation, or use thereof. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. The exemplary drawings are for purposes of illustration only and the dimensions, positions, order and relative sizes reflected in the drawings attached hereto can vary.

Figure 1:
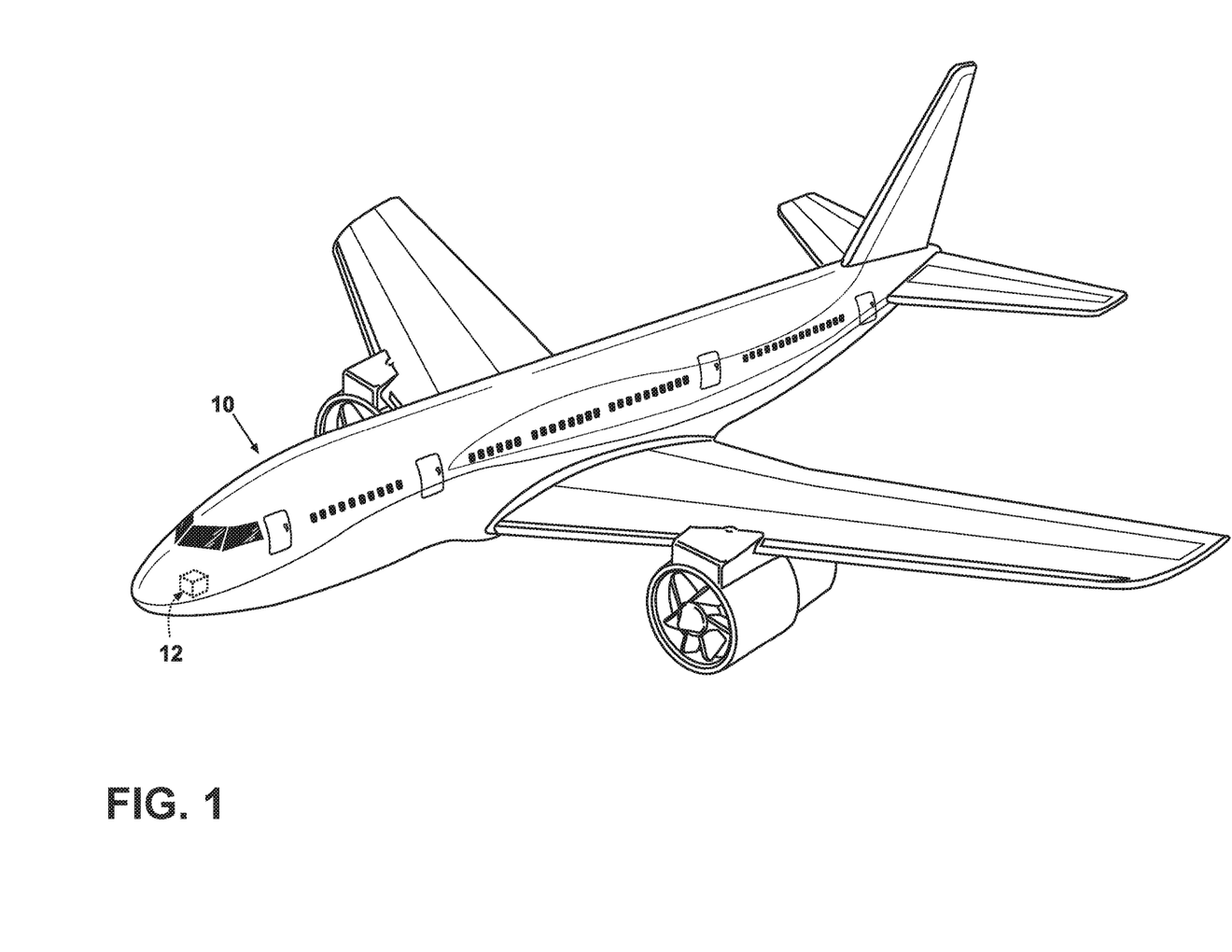
FIG. 1 is a perspective view of an aircraft having an avionics chassis in accordance with various aspects described herein.

FIG. 1 schematically illustrates an aircraft 10 with an on-board avionics chassis 12 (shown in phantom) for housing avionics or avionics components for use in the operation of the aircraft 10. The avionics chassis 12 houses a variety of avionics elements and protects them against contaminants, electromagnetic interference (EMI), radio frequency interference (RFI), vibrations, and the like. While illustrated in a commercial airliner, the avionics chassis 12 can be used in any type of aircraft, for example, without limitation, fixed-wing, rotating-wing, rocket, commercial aircraft, personal aircraft, and military aircraft. The avionics chassis 12 can be located anywhere within the aircraft, not just the nose as illustrated. Furthermore, aspects of the disclosure are not limited only to aircraft aspects, and can be included in other mobile and stationary configurations. Non-limiting example mobile configurations can include ground-based, water-based, or additional air-based vehicles.

Figure 2:
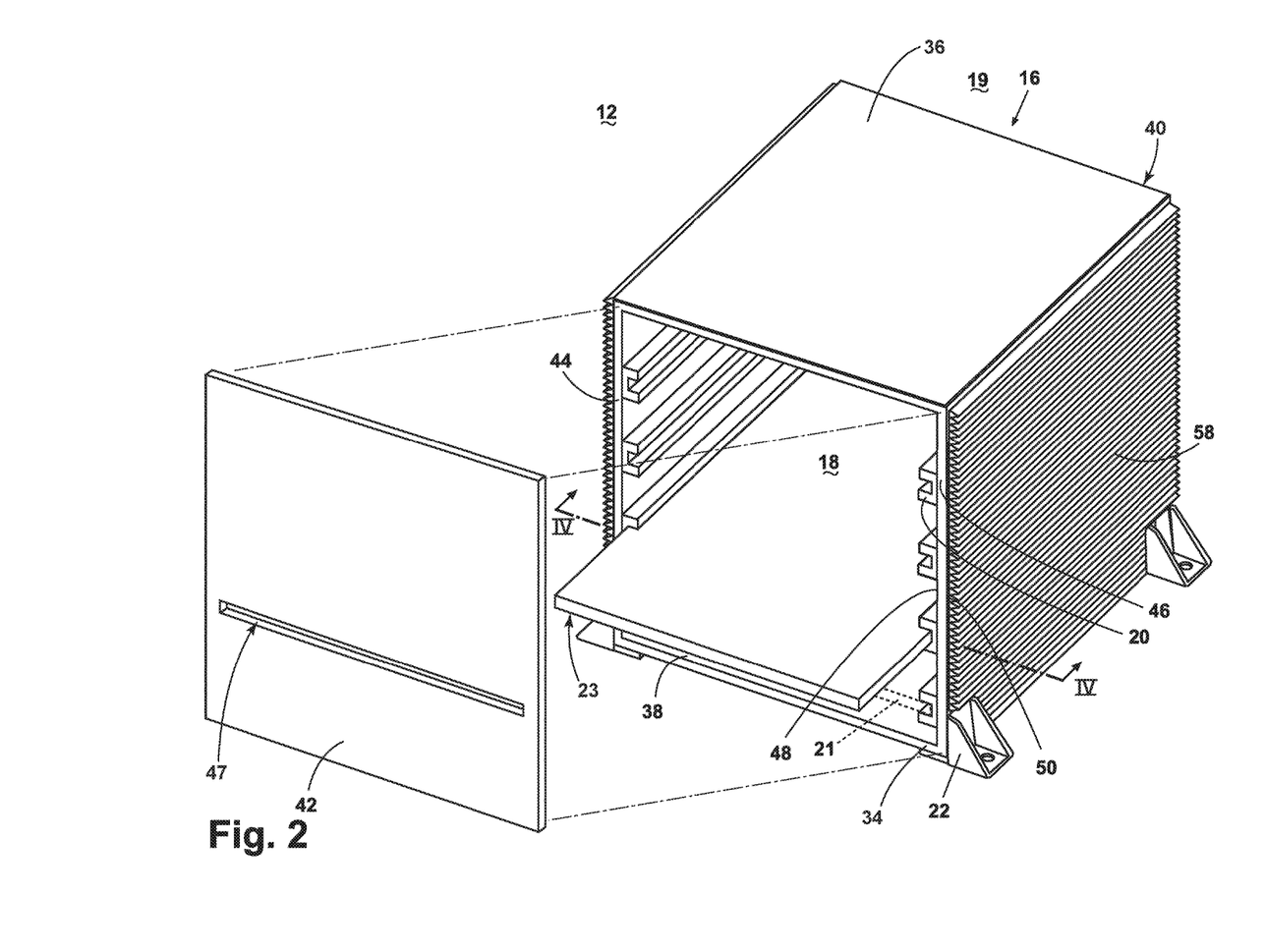
FIG. 2 is a partially exploded perspective view of the avionics in accordance with various aspects described herein, with a cover removed for clarity.

FIG. 2 illustrates the avionics chassis 12 according to an aspect of the present disclosure, with a front cover 42 removed. The avionics chassis 12 includes a chassis housing 16 defining an interior 18 and exterior 19 of the chassis 12. The avionics chassis 12 can includes a chassis frame 34 having a top cover 36, a bottom wall 38, a back wall 40, and opposing side walls 44, 46, collectively referred to as the walls. The frame 34 can further include the aforementioned selectively removable front cover 42, providing access to the interior 18 of the avionics chassis 12 when removed, and partially restricting access to the interior 18 when coupled or mounted with the frame 34. The side walls 44, 46 can include an interior surface 48 and an exterior surface 50. As shown, a set of heat-dissipating elements, such as fins 58, can project from the exterior surface 50 of the walls 44, 46. While heat-dissipating fins 58 are shown, a number of heat-dissipating elements or heat-dissipating configurations can be utilized by the side walls 44, 46 to remove or dissipate at least a portion of heat generated by or within the avionics chassis 12, or heat stored by the avionics chassis 12.

The avionics chassis 12 can further include a set of thermally conductive card rails 20 within the interior 18 and supported by the interior surface 48 of the side walls 44, 46. The set of card rails 20 can be horizontally aligned on the interior surfaces 48 of the spaced on opposing side walls 44, 46 to define effective card slots 21 (illustrated by the dotted lines) there between for receiving at least a portion of an operable avionics system card 23. While only a single avionics system card 23 is shown, the avionics chassis 12 can be configured to house, support, or include a set of avionics system cards 23.

The removable front cover 42 can be selected or configured to include a set of cover openings 47 that can be aligned with a corresponding set of avionics system cards 23 such that when the front cover 42 is coupled or mounted with the frame 32, at least a portion of the avionics system card 23 can extend from the interior 18 to the exterior 19 of the avionics chassis 12. Stated another way, the avionics chassis 12 or the avionics system card 23 can be selected or configured such that at least a portion of an avionics system card 23 can extend through a corresponding opening 47 or aperture in the chassis 12 or front cover 42. In this sense, the opening 47 can be sized, shaped, profiled, or contoured to align or correspond with at least a portion of the avionics system card 23. While the avionics system card 23 is illustrated extending through an opening 47 in the front cover 42, aspects of the disclosure can be included wherein the avionics system card 23 is selected, designed, or configured such that at least a portion of the card 23 extends beyond or past a physical or referential plane defined by the avionics chassis 12, front cover 42, side walls 44, 46, frame 34, or combination of boundaries thereof.

The avionics chassis 12 is further illustrated including a set of mounting feet 22 extending from the chassis housing 16 to facilitate mounting the avionics chassis 12 to the aircraft 10 by means of bolts or other conventional fasteners. Further, the mounting feet 22, can function as an electrical ground for grounding the avionics chassis to the frame of the aircraft 10. While mounting feet 22 are shown in this example the avionics chassis 12 can be used with many types of attachment mechanism.

Figure 3:
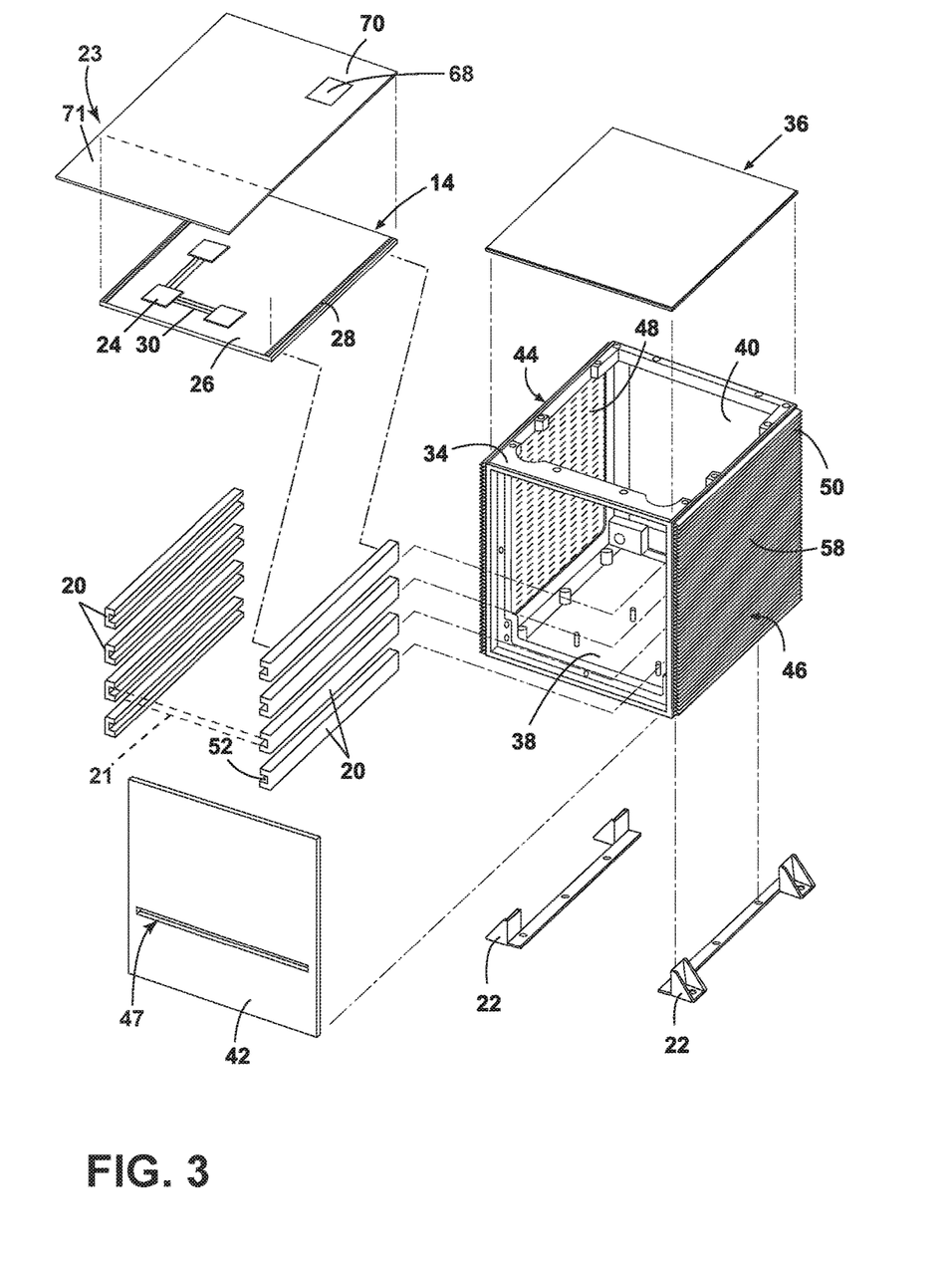
FIG. 3 is an exploded view of the avionics chassis shown in FIG. 2, in accordance with various aspects described herein.

FIG. 3 illustrates an exploded view illustrating the avionics chassis 12 and avionics system card 23 in more detail. As shown, the avionics system card 23 can include a heat spreader or thermal plane 70 and circuit card assembly, shown as a printed circuit board (PCB) 14 or electronic circuit board. The PCB 14 can further include a substrate 26 supporting or carrying a set of or heat producing components 24. The PCB 14 or the substrate 26 can further include a set of electrical or thermal conductors 30 interconnecting the set of heat producing components 24. A non-limiting list of heat producing components 24 can include electrical circuitry, power electronics such as capacitors, transformers, or the like, a semiconductor chip, a processor, memory chips, or the like.

The substrate 26 can include a thermally conductive or non-conductive material. The PCB 14 or substrate 26 can be provided with thermally conductive side strips 28 located along the exterior edges of the PCB 14. The conductors 30 can be configured to operate or create at least a portion of a thermally conductive path from the heat producing component 24 to an edge of the substrate 26 or PCB 14, such as to the thermally conductive side strips 28. In this sense, the conductors 30 can provide a direct thermal pathway from the interior to the periphery of the substrate 26. The side strips 28 can further provide a thermally conductive interface or pathway to the card rails 20. The conductors 30 can be one or more metal strips, including, but not limited to, copper or another electrically or thermally conductive material formed in or provided on the substrate 26.

The thermal plane 70 can be configured in an overlying relationship with the PCB 14, and can further include an extending thermal plane portion 71 of the thermal plane 70. The extending thermal plane portion 71 is shown to extend parallel to the longitudinal direction of the side strips 28, that is, extending in the direction of a front of the PCB 14 or avionics system card 23, wherein the extending thermal plane portion 71 can be at least partially received by, or extend through the cover opening 47 of the front cover 42 in an assembled avionics chassis 12. The thermal plane 71 and the extending thermal plane portion 71 can include a thermally conductive material, including but not limited to copper. When the thermal plane 70 and the extending thermal plane portion 71 are assembled with the PCB 14 to form the avionics system card 23, the planes 70, 71 are configured to be arranged in a thermally conductive relationship with at least a subset of the heat producing components 24, the conductors 30, or the side strips 28. In this sense, heat generated or produced by at least a subset of operable heat producing components 24 can be thermally conducted to the overlying thermal plane 70, which the heat can be further thermally conducted to the side strips 28, to the extending thermal plane portion 71, or a combination thereof.

The illustration of the thermal plane 70 and the extending thermal plane portion 71 indicates the plane 70 and plane portion 71 are separated by a dotted line for understanding. Aspects of the disclosure can be included wherein the thermal plane 70 and extending thermal plane portion 71 are a single integral plane, or are separate planes thermally coupled to one another. In one non-limiting example configuration, the cover opening 47 can be configured to receive only the thermal plane 70 or the extending thermal plane portion 71. In another non-limiting example configuration, the front cover 42 can include a set of cover openings 47 configured or selected to receive a corresponding set of thermal planes 70 or extending thermal plane portions 71.

Aspects of the disclosure can be included wherein the extending thermal plane portion 71 can be configured in an overlying relationship with the PCB 14, such as a PCB 14 also having an extending portion, or the extending thermal plane portion 71 can be configured to extend beyond the relationship with the PCB 14. Aspects of the disclosure can also be included wherein the thermal plane 70 or the extending thermal plane portion 71 can include discontinuities, such as gaps, holes, or cutouts 68. For example, a cutout 68 can be included to reduce materials, so long as the cutout 68 does not inhibit the thermally conductive relationship of the respective plane 70, 71 with the heat producing component 24 or conductor 30.

The set of card rails 20 for the avionics chassis 12 can be configured to abut the interior surface 48 and can be fixedly mounted thereto. The set of card rails 20 can be attached to the interior surface 48 using any convenient method such as mechanical fasteners, solders, brazes, welds, adhesives, and the like. Aspects of the card rail 20 can be configured to include two legs that define a groove or channel 52, extending along the length of the side walls 44, 46 (e.g. from front to back, or between the front cover 42 and the back wall) which partially defines the slot 21 for receiving the avionics system card 23. The set of card rails 20 can be arranged in pairs, with one card rail 20 residing on the side wall 44 and a corresponding card rail 20 residing on the side wall 46. Parallelism between the pair of card rails 20 can be utilized to ensure that the PCB 14 or the avionics system card 23 will slide into the slot 21 or channel 52 properly. The interaction of the pair of card rails 20 and the PCB 14 or the avionics system card 23 can be referred to as "wedge locks." The card rails 20 can be made of any suitable thermally conductive material including either machined or extruded aluminum, copper, aluminum/beryllium alloy, machined silicon carbide or a metal matrix composite. Aspects of the disclosure can further be included wherein the attachment of the set of card rails 20 to the side walls 44, 46 include a thermally conductive relationship, such that the set of card rails 20 are thermally coupled with at least one of the side walls 44, 46, the avionics chassis 12, or the heat-dissipating fins 58.

Figure 4:
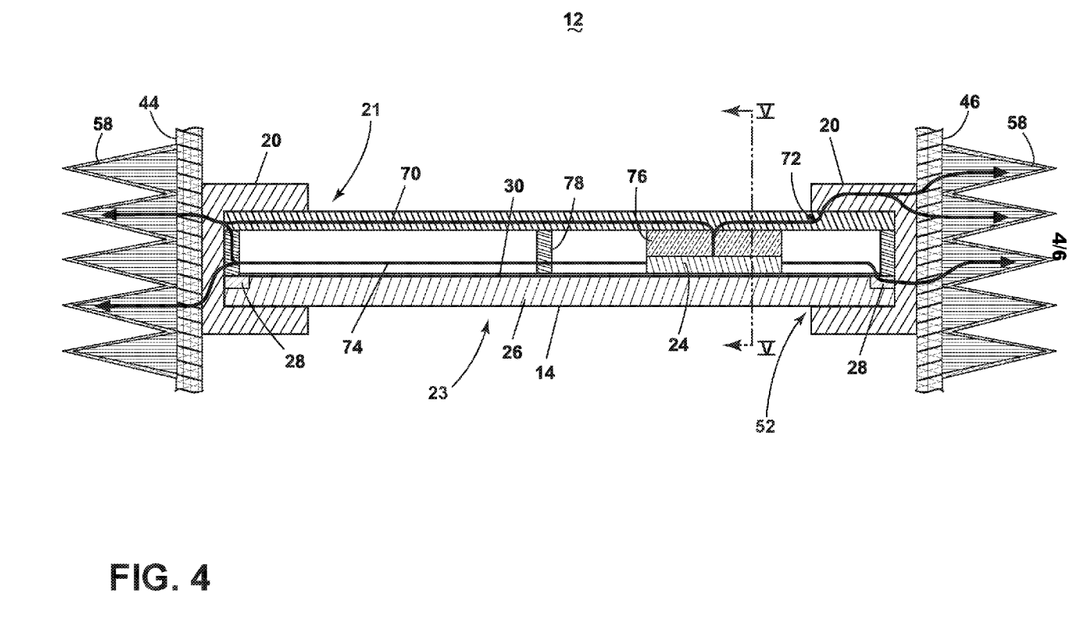
FIG. 4 is a cross-sectional view taken along the line IV-IV of a portion of the avionics chassis shown in FIG. 2, in accordance with various aspects described herein.

FIG. 4 illustrates a cross-sectional view of a portion of the assembled avionics chassis 12 taken along line IV-IV of FIG. 2, including an avionics system card 23 mounted between opposing side walls 44, 46 and card rails 20. As shown, the PCB 14 defines a first primary plane, the thermal plane 70 defines a second primary plane, and the spatial relationship between the PCB 14 and the thermal plane 70 is such that the first and second primary planes are located within the slot 21 when the avionics system card 23 is received within the slot 21. In another aspect of the disclosure, the PCB 14 or the thermal plane 70 can be configured such that the spatial relationship between the PCB 14 and the thermal plane 70 are such that the first primary plane, the second primary plane, or a combination thereof, are not completely within the envelope of one slot 21 when the avionics system card 23 is received within the slot 21 or received between the set of card rails 20.

As shown, the avionics system card 23, the PCB 14, or the thermal plane 70 can further include an optional thermal pad 76 or a set of stiffeners 78. The optional thermal pad 76 can include a thermally conductive material, such as a carbon composite, a metal or a thermally conductive paste, and can be positioned in thermally conductive contact with a heat producing component 24 and the thermal plane 70 of an assembled avionics system card 23. Alternatively, the thermal plane 70 can be directly thermally coupled with the heat producing component 24. The optional set of stiffener 78 can be located between the PCB 14 and the thermal plane 70 when the avionics system card 23 is located within the slot 21. In one aspect of the disclosure, the set of stiffener 78 can be operably coupled to the PCB 14 so that the PCB 14 will not flex or vibrate within the slot 21. In another aspect of the disclosure, the set of stiffeners 78 can be configured to set or maintain a predetermined spacing or range of spacing between the PCB 14 and the thermal plane 70. The stiffener 78 can be included of aluminum or similar thermally conductive material and can have a variety of configurations to provide support for the PCB 14. Yet another aspect of the disclosure can include any suitable shape, composition, or configuration of a set of stiffener 78 for the avionics card assembly. In yet another aspect of the disclosure, at least one of the set of stiffeners 78 or the thermal pad 76 can be integral to, or include the same material as the thermal plane 70 or the PCB 14.

When the avionics system card 23 is assembled in the slot 21, the thermal plane 70 can be conductively coupled to at least one of the set of card rails 20 to form a portion of a first conductive path 72. The PCB 14 can further be conductively coupled to the same or another of the set of card rails 20 to form a portion of a second conductive path 74. The first conductive path 72 begins with the heat-producing component 24; heat is conducted through the thermal pad 76 to the thermal plane 70, which in turn conducts that heat laterally to the card rails 20. The first conductive path 72 continues through the card rails 20 to either the side walls 44, 46 themselves, or to an additional heat-dissipating components such as the fins 58. In an aspect of the disclosure, heat can be conducted first to a side wall 44, 46, then to an additional heat-dissipating component. Heat can be dissipated through at least one of the side walls 44, 46, or heat-dissipating components into the air or environment surrounding the avionics chassis 12 by way of convection or radiation.

The second conductive path 74 begins with the heat-producing component 24; heat is then transferred through the conductors 30 of the PCB 14 to the set of thermally conductive side strips 28. Although the arrows illustrated in FIG. 4 are offset from the conductors 30, this is done for illustrative purposes and the conductors 30 are actually a portion of the second conductive path 74. The arrow has merely been offset so that it does not obscure the conductors 30 in the illustration. The set of side strips 28 can the card rail 20 and heat, in turn, conducts from the card rail 20 either through the side walls 44, 46 themselves, or to an additional heat-dissipating components such as the fins 58. As with the first conductive path 72, in an aspect of the disclosure, heat traversing the second conductive path 74 can be conducted first to a side wall 44, 46, then to an additional heat-dissipating component. Heat can be dissipated through at least one of the side walls 44, 46, or heat-dissipating components into the air or environment surrounding the avionics chassis 12 by way of convection or radiation. Thus, the PCB 14 also acts as a heat spreader by itself. This allows the avionics chassis 12 to run much cooler with the additional conductive path provided by the thermal plane 70.

As shown, the height of the PCB 14 can be configured such that the PCB 14 and the thermal plane 70 are both received within the channel 52. Also as shown, the PCB 14 can be configured to be in direct contact with the main portion of the card rail 20. The thermal plane 70 can also be configured to be in direct contact with a leg of the card rail 20 and in direct contact with the main portion of the card rail 20. Alternatively, the contact between the PCB 14 and the set of card rails 20 or the contact between the thermal plane 70 and the set of card rails 20 could be indirect contacts.

While the thermal plane 70 is shown attached to the top of the PCB 14 (e.g. overlying), aspects of the disclosure can be included wherein the thermal plane 70 is attached below the PCB 14 (e.g. underlying). In this other aspect of the disclosure, the heat generating components 24 can be positioned between the substrate 26 and the thermal plane 70, or the thermal plane 70 can directly or indirectly abut the substrate such that heat can be conducted through the substrate to the thermal plane 70.

Figure 5:
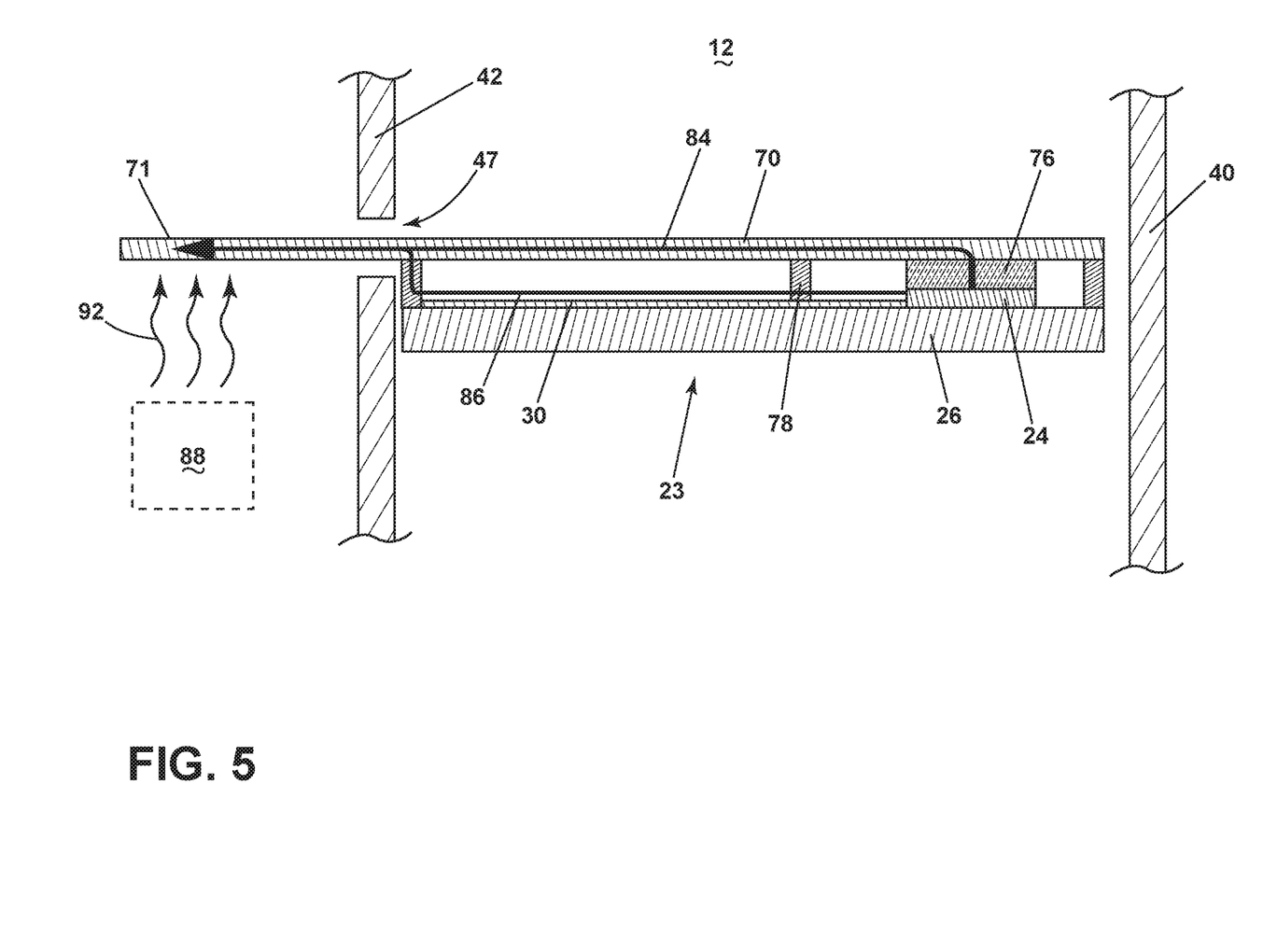
FIG. 5 is a cross-sectional view taken along the line V-V of a portion of the avionics chassis shown in FIG. 4, in accordance with various aspects described herein.

FIG. 5 illustrates a cross-sectional view of a portion of the assembled avionics chassis 12 taken along line V-V of FIG. 4, including an avionics system card 23 mounted between the back wall 40 and the front cover 42, and wherein at least a portion of the extending thermal plane portion 71 extends beyond, or protrudes through the opening 47 of the front cover 42. The illustration further illustrates a third conductive path 84 and a fourth conductive path 86.

The third conductive path 84 begins with the heat-producing component 24; heat is conducted through the thermal pad 76 to the thermal plane 70, which in turn conducts that heat laterally to the extending thermal plane portion 71, which is external to the avionics chassis 12. Heat can then be dissipated into the air or environment surrounding the avionics chassis 12 by way of convection or radiation. In one aspect of the disclosure, the heat can be removed from the extending thermal plane portion 71 through passive conduction or radiation to the environment. In another aspect of the disclosure, the heat can be removed from the extending thermal plane portion 71 by an external cooling system 88, which can be configured to provide an active cooling medium 92 to the extending thermal plane portion 71 external to the avionics chassis 12. Non-limiting examples of an external cooling system 88 and active cooling medium 92 can include a fan providing forced air to at least a portion of the extending thermal plane portion 71, or a liquid cooling circuit providing liquid coolant to at least a portion of the extending thermal plane portion 71. In the non-limiting example of liquid cooling, a liquid coolant reservoir can be fluidly coupled with a set of coolant channels arranged within the extending thermal plane portion 71, such that the liquid coolant can be forced or pumped through the channels to define a liquid cooling circuit. Additional external cooling systems 88 can be included.

The fourth conductive path 86 begins with the heat-producing component 24; heat is then transferred through the conductors 30 of the PCB 14 to the thermal plane 70, for instance, by way of a thermally conductive stiffener 78. Again, although the arrows illustrated in FIG. 5 are offset from the conductors 30, this is done for illustrative purposes and the conductors 30 are actually a portion of the second conductive path 74. The thermal plane 70 conducts the heat laterally to the extending thermal plane portion 71 external to the avionics chassis 12. The heat conducted to the extending thermal plane portion 71 external to the avionics chassis 12 can then be actively or passively removed to the surrounding environment, as explained above.

Thus, aspects of the disclosure describe an avionics chassis having a portion of a thermal plane extending beyond the chassis, and wherein heat generated by a heat generating component can be dissipated outside of the chassis by way of the thermal plane. The heat dissipation by way of the thermal plane extending external to the chassis can provide supplemental thermal dissipation, or can replace existing thermal dissipation by way of the set of card rails 20 or side walls 44, 46. This allows the avionics chassis 12 to run much cooler with the additional conductive paths provided by the thermal plane 70 and the extending thermal plane portion 71.

Figure 6:
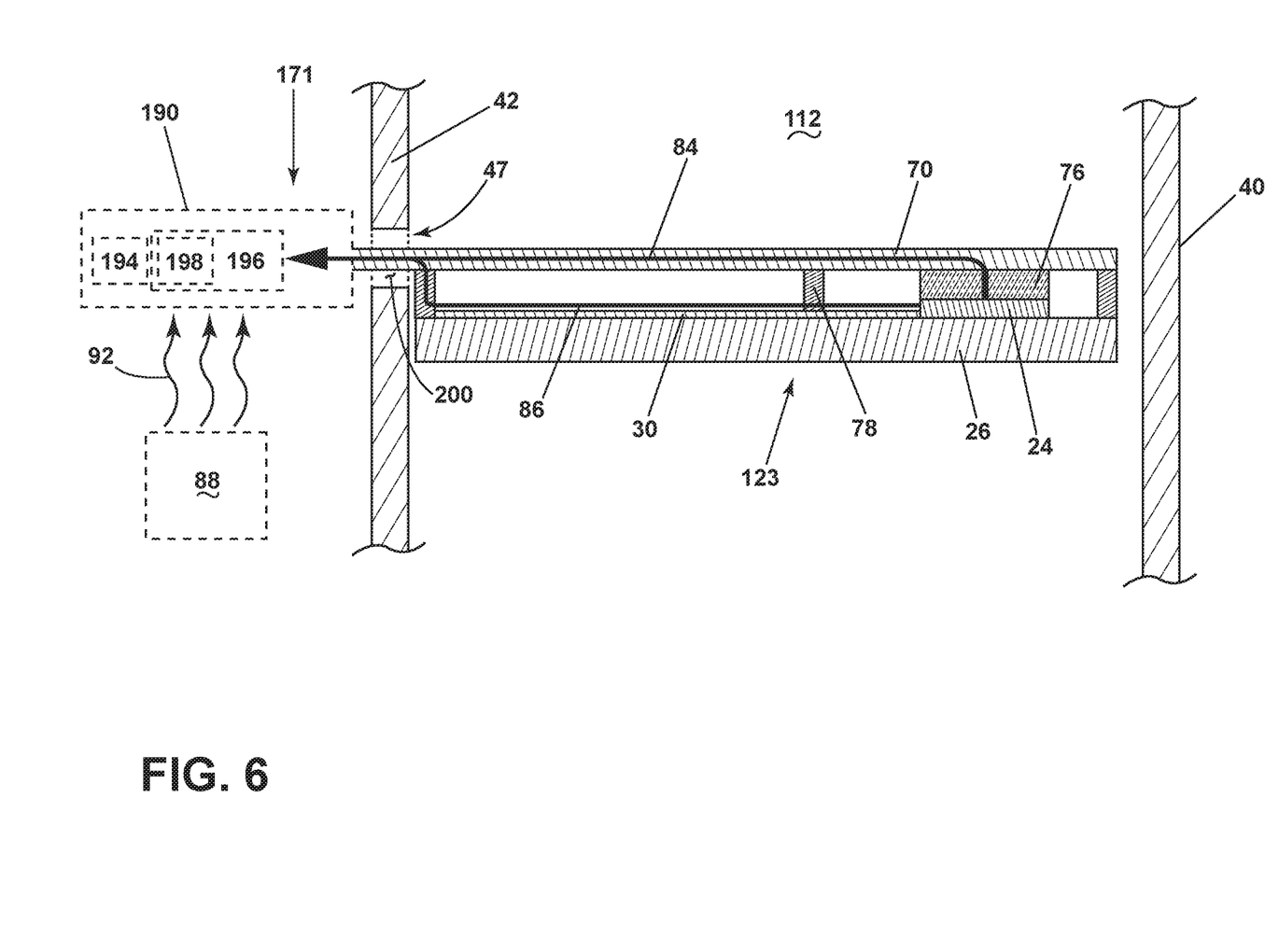
FIG. 6 is a cross-sectional view of a portion of the avionic chassis, wherein a thermal plane includes a heat-dissipating configuration, in accordance with various aspects described herein.

FIG. 6 illustrates another avionics chassis 112 according to another aspect of the present disclosure. The avionics chassis 112 is similar to the avionics chassis 12; therefore, like parts will be identified with like numerals increased by 100, with it being understood that the description of the like parts of the avionics chassis 12 applies to the avionics chassis 112, unless otherwise noted. One difference is that the extending thermal plane portion 171 of the avionics system card 123 includes an additional heat-dissipating configuration (shown schematically as box 190) external to the avionics chassis 112. Non-limiting aspects of the heat-dissipating configuration can include heat-dissipating fins, heat-dissipating pin fins, heat pipes, thermally conductive inlays, or apertures or channels to allow coolant fluid flow to traverse through or proximate to the extending thermal plane portion 171. Thus, as described herein, a set of heat dissipating configurations or heat spreaders of various designs, constructions, and thermally conductive or thermally dissipative materials can be included. The heat-dissipating configuration 190 can be configured to increase the exterior surface area of the extending thermal plan portion 171 allowing more heat to be transferred to the surrounding air through convection.

The enhanced heat spreader or thermal plane 70 further retains all the avionics chassis 12 and avionics system card 23 mating features, including typical wedge locks, so that it can be fitted or retrofitted in a standard chassis 12. The wedge lock heat conduction path (e.g. the first and second conductive paths) remains available, while being supplemented by a solid conduction path (e.g. the third and fourth conductive paths) directly to the environment or to the chosen heat exchanger mechanism. The heat exchanger portion can be built in various heights and thicknesses to provide varying degrees of additional heat dissipation capabilities while retaining compatibility with standard avionics system card 23 pitches.

Configurations can be included wherein one or more of the heat-dissipating configuration(s) 190 can be parallel to, offset from, or normal to the planar surface of the thermal plane 70. In another aspect, the heat-dissipating configuration 190 can include a first heat-dissipating configuration on the top portion of the configuration 190, and a second heat-dissipating configuration on the bottom portion of the configuration 190. The corresponding top or bottom heat-dissipating configurations can be configured or selected based on an expected or desired heat-generation of the heat producing component 24, thermal plane 70, or avionics system card 23, 123. In another aspect of the disclosure, the heat-dissipating configuration 190 can be selected or configured based on expected or desired heat-dissipating characteristics of the heat producing component 24, thermal plane 70, or avionics system card 23, 123.

In yet another aspect, the heat-dissipating configuration 190 can be selected or configured based on external environment characteristics or an available external cooling system 88. In one non-limiting example, if a forced air stream is available as a portion of an external cooling system 88, the heat-dissipating configuration 190 can include a set of fins or pin fins (schematically shown as box 194) configured to receive and thermally interact with the forced air stream.

In another aspect, the heat-dissipating configuration 190 can include a housing (schematically shown as box 196) configured to hold a phase-change material (schematically shown as box 198). The phase change material can include, but is not limited to, paraffin wax, a solid which changes phase to a liquid when sufficient heat is absorbed, and further changes phase from a liquid back to a solid when sufficient heat is released. A typical melting point of paraffin wax is between 46 and 68 degrees Celsius. After the phase change from solid to liquid, the paraffin wax is able to further absorb supplementary heat, beyond the heat causing the phase change to occur. The paraffin wax is configured to repeatedly change phase from a solid to a liquid, and back to a solid, reliably for multiple cycles. Other phase change materials, including but not limited to ammonia, can be included, so long as the material changes phase from a starting phase to at least one different phase in response to the conductive transfer of heat. The starting phase and at least one different phase can be one of solid, liquid, and gas.

Thus, the phase-change material can reliably store or absorb a first amount of heat from the thermal plane 70 and melt from a solid to a liquid. The phase-change material can further reliable store or absorb a second amount of heat from the thermal plan 70 in liquid form as well. The heat stored or absorbed by the phase-change material can then be dissipated over a period of time to the external environment, or by way of the aforementioned heat-dissipating configurations 190. The first and second amounts of heat can originate from the heat producing component 24 during normal operation, or can originate from the heat producing component 24 during a temporary or transient time of high-energy or high-heat-producing operations, or during a loss of cooling system 88 operations.

In yet another aspect, at least a portion of the heat-dissipating configuration 190 can include carbon black material to increase the convection of heat to the external environment.

Furthermore, since the extending thermal plane portion 71, 171 is not physically restrained or constrained by the internal volume of the avionics chassis 12, 112, aspects of the heat-dissipating configuration 190 can include heat-dissipating elements configured in a non-parallel direction, relative to the thermal plane 70. In one non-limiting example, a heat-dissipating configuration 190 can include a set of heat-dissipating elements arranged in parallel with the front cover.

In yet another aspect, the extending thermal plane portion 71, 171 can be a separate element from the thermal plane 70, and can be mounted or thermally coupled with the thermal plane 70. In this sense, the avionics chassis 12, 112 can be assembled without the extending thermal plane portion 71, 171, which can be mounted to the thermal plane 70 through the opening 47. In another non-limiting configuration, a thermal plane 70, separate from the extending thermal plane portion 71, 171, can extend through the opening 47 during assembly, such that the extending thermal plane portion 71, 171 can be mounted with the thermal plane 70 from the exterior 19 of the avionics chassis 12. In this sense, aspects of the disclosure can be included in existing avionics system cards 23, 123, or retro-fitted to be included in existing avionics system cards 23, 123, by including the extending thermal plane portion 71, 171 and an opening 47 in the front cover 42.

In yet another aspect, the front cover, the opening 47, the thermal plane 70, or the extending thermal plane portion 71 can include environmental or electromagnetic interference seals 200 to ensure environmental compatibility within the interior 18 of the avionics chassis 12.

Non-limiting aspects of the disclosure can include a method of assembling a heat-dissipating assembly for the avionics chassis 12, 112. For example, the method can include selecting a thermal plane 70, 71, 171 for overlying the heat producing component 24. The method can also include overlying the thermal plane 70, 71, 171 adjacent to the heat producing component 24 such that the heat producing component 24 and the thermal plane 70, 71, 171 are in a thermally conductive relationship. Then, the method can include mounting the thermal plane 70, 71, 171 and the heat producing component 24 within a housing, such as the avionics chassis 12, having a set of planar walls defining an interior 18 of the housing and an exterior 19 of the housing. At least a portion of the thermal plane 70, 71, 171 can extend from the interior 18 of the housing beyond at least one of the planar walls, such as the front cover 42, to the exterior 19 environment surrounding the housing. At least one of the thermal plane 70, 71, 171 or the planar wall can be selected based on retro-fitting an existing avionics chassis 12, avionics system card 23, or heat producing component 24.

The aspects of the present disclosure provide a heat-dissipating configuration for an avionics system card or heat producing component. The technical effect is that the aspects described herein enable the cooling of said heat producing component by way of laterally conducting at least a portion of heat generated to a thermal plane portion forwardly extending past the avionics chassis or housing. One advantage that can be realized is superior cooling capabilities compared with conventional systems. Thus, even during expected environmental conditions and diurnal cycles, a thermal plane can dissipate heat generated by a heat producing component.

By increasing the heat-dissipation, a higher power density can be achieved in the same avionics system card or constrained space. An increased power density allows for increased computational power or increased sensor or emitter power supported within the physically-constrained space, weight-constrained space, or volume-constrained space. Yet another advantage is that thermal plane configurations allow for the retro-fitting of additional capabilities within existing avionics chassis, or the design of a new system with power densities not currently achievable using convention thermal dissipation configurations.

Many other possible configurations in addition to that shown in the above figures are contemplated by the present disclosure. In one non-limiting example, while the front cover has been described as including the opening, any of the walls of the chassis can be configured to include the opening such that the extending thermal plane portion is received through the opening. To the extent not already described, the different features and structures of the various aspects can be used in combination with others as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the invention, including the best mode, and also to enable any person skilled in the art to practice aspects of the invention, including making and using any devices or systems and performing any incorporated methods. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An avionics chassis assembly, comprising: a housing having an outer surface, defining an exterior of the housing, an inner surface, defining an interior of the housing, and a set of walls at least partially separating the exterior of the housing from the interior of the housing; a heat generating component located within the interior of the housing; a thermal plane thermally coupled to the heat generating component and configured to direct heat away from the heat generating component; and an electronic circuit board wherein the heat generating component is mounted to the electronic circuit board, wherein an opening is included in the housing and the opening is configured to receive at least a portion of the thermal plane such that the at least a portion of the thermal plane passes through the opening and is located exteriorly of the housing to define an extending thermal plane portion, wherein the thermal plane overlies the electronic circuit board, and wherein the extending thermal plane portion comprises electromagnetic interference seals to ensure environmental compatibility with the interior of the housing; and wherein the housing comprises a selectively removable front cover, wherein the opening is located within the front cover, and wherein the opening comprises a laterally-extending slot.

2. The avionics chassis assembly of claim 1 wherein the opening is sealed about the thermal plane.

3. The avionics chassis assembly of claim 1 wherein the extending thermal plane portion comprises a heat-dissipating configuration.

4. The avionics chassis assembly of claim 3 wherein the heat-dissipating configuration comprises at least one of a set of fins, a set of pin fins, a set of heat pipes, a set of thermally conductive inlays, or carbon black material.

5. The avionics chassis assembly of claim 3, further comprising an external cooling system providing a forced air stream to the heat-dissipating configuration.

6. The avionics chassis assembly of claim 5 wherein the heat-dissipating configuration comprises channels configured to receive a cooling fluid from the external cooling system.

7. The avionics chassis assembly of claim 6 wherein the heat-dissipating configuration comprises a phase-change material.

8. The avionics chassis assembly of claim 7 wherein the phase-change material comprises paraffin wax.

9. The avionics chassis assembly of claim 1 wherein the thermal plane is configured to conduct heat laterally along the thermal plane to an extending thermal plane portion.

10. A heat-dissipating assembly, comprising:
a housing having a set of planar walls defining an exterior of the housing and an interior of the housing, the housing having one or more openings;
an electronic circuit board comprising a heat generating component, where the electronic circuit board is received within the interior of the housing; and
a thermal plane in a thermally conductive relationship with the heat generating component and extending from the interior of the housing through the one or more openings beyond at least one planar wall of the set of planar walls into an exterior environment surrounding the housing to define an extending thermal plane portion;
wherein the thermal plane is configured to conduct heat away from the heat generating component beyond the at least one planar wall and dissipate at least a portion of the heat to the exterior environment,
wherein the portion of the thermal plane in the interior of the housing is coplanar with the extending thermal plane portion,
wherein the at least one planar wall comprises an opening receiving the extending thermal plane portion, and
wherein the opening comprises a laterally-extending slot.

11. The heat-dissipating assembly of claim 10 wherein at least a portion of the extending thermal plane portion includes at least one of a set of fins, a set of pin fins, a set of heat pipes, a set of thermally conductive inlays, carbon black material, a set of coolant channels, or a phase-change material.

12. The heat-dissipating assembly of claim 10 wherein the thermal plane and the extending thermal plane portion are integral with each other.

13. A method of assembling a heat-dissipating assembly, comprising:
overlying a thermal plane adjacent a heat producing component such that the heat producing component and the thermal plane are in a thermally conductive relationship;
mounting the thermal plane and the heat producing component within a chassis having a set of planar walls defining an interior of the housing;
mounting a cover comprising an opening for receiving the extending thermal plane portion to the chassis; and
providing one or more openings in the set of planar walls, wherein at least a portion of the thermal plane extends beyond the housing through the one or more openings in the set of planar walls into an exterior environment surrounding the housing to define an extending thermal plane portion.

14. The method of claim 13 wherein overlying, mounting within the chassis, and mounting the cover comprise retrofitting an existing chassis or an existing heat producing component.

15. The method of claim 14 wherein the thermal plane includes a heat-dissipating configuration, and
wherein the thermal plane comprises a thermally conductive material comprising at least one of copper and an aluminum beryllium alloy.

* * * * *